(12) United States Patent
Schmitt

(10) Patent No.: US 6,272,010 B1
(45) Date of Patent: *Aug. 7, 2001

(54) PERIPHERAL DEVICE MOUNTING APPARATUS

(75) Inventor: Ty R. Schmitt, Round Rock, TX (US)

(73) Assignee: Dell USA, L.P., Round Rock, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/014,354

(22) Filed: Jan. 27, 1998

(51) Int. Cl.[7] .............. G01F 1/16; H05K 7/16; H05K 7/00; H05K 5/00; H05K 1/00
(52) U.S. Cl. ............ 361/685; 361/725; 361/802; 361/741; 361/756; 361/726; 361/686; 439/377
(58) Field of Search ........................ 361/685, 686, 361/684, 683, 725, 726, 741, 756, 786, 802; 439/61, 64, 377; 211/41.17

(56) References Cited

U.S. PATENT DOCUMENTS

| | | | |
|---|---|---|---|
| 4,233,646 | 11/1980 | Leung et al. ............. | 361/399 |
| 4,602,829 | * 7/1986 | De Andrea ............... | 312/320 |
| 4,632,588 | 12/1986 | Fitzpatrick ............... | 403/16 |
| 4,991,062 | * 2/1991 | Nguyenngoc ............. | 361/424 |
| 5,006,951 | * 4/1991 | Albert et al. ............. | 361/220 |
| 5,077,722 | 12/1991 | Geist et al. ............. | 369/75.1 |
| 5,222,897 | 6/1993 | Collins et al. ............ | 439/157 |
| 5,247,427 | * 9/1993 | Driscoll et al. ........... | 361/685 |
| 5,277,615 | 1/1994 | Hastings et al. .......... | 439/377 |
| 5,339,221 | * 8/1994 | Conroy-Wass et al. ..... | 361/796 |
| 5,386,346 | * 1/1995 | Gleadall ................. | 361/799 |
| 5,396,401 | 3/1995 | Nemoz ................... | 361/690 |
| 5,434,752 | 7/1995 | Huth et al. .............. | 361/798 |
| 5,503,472 | 4/1996 | Vu et al. ................ | 312/223.2 |
| 5,535,092 | 7/1996 | Bang .................... | 361/685 |
| 5,557,499 | * 9/1996 | Reiter et al. ............ | 361/685 |
| 5,579,204 | 11/1996 | Nelson et al. ........... | 361/685 |
| 5,652,695 | 7/1997 | Schmitt .................. | 361/385 |
| 5,654,873 | 8/1997 | Smithson et al. ......... | 361/685 |
| 5,673,172 | 9/1997 | Hastings et al. .......... | 361/685 |
| 5,696,668 | * 12/1997 | Zenitani et al. .......... | 361/802 |
| 5,751,551 | 5/1998 | Hileman et al. .......... | 361/753 |
| 5,751,558 | * 5/1998 | Gullicksrud et al. ....... | 361/801 |
| 5,757,617 | 5/1998 | Sherry ................... | 361/685 |
| 5,790,374 | 8/1998 | Wong .................... | 361/685 |
| 5,822,184 | * 10/1998 | Rabinovitz .............. | 361/685 |
| 5,828,546 | 10/1998 | Tirrell et al. ............ | 361/685 |

* cited by examiner

Primary Examiner—Leo P. Picard
Assistant Examiner—Jagdish Patel
(74) Attorney, Agent, or Firm—Skjerven Morrill MacPherson LLP; Marc R. Ascolese

(57) ABSTRACT

A peripheral device mounting apparatus including a peripheral device bay with carrier guides located to accommodate at least two different types of peripheral devices, and a keying mechanism allowing carrier insertion only into certain carrier guides, advantageously provides optimal use of the device bay space for a particular type of peripheral device. Additionally, the keying mechanism prevents installation of a peripheral device into the bay in a location that wastes bay space.

24 Claims, 4 Drawing Sheets

PERIPHERAL DEVICE MOUNTING APPARATUS

RELATED APPLICATIONS

This application relates to the co-pending U.S. patent application Ser. No. 09/013,956 entitled "Peripheral Device Carrier," by Ty R. Schmitt, filed the same day as the present application, and incorporated herein by reference.

BACKGROUND OF THE INVENTION

1. Field of the Invention

This invention relates to computer equipment enclosures, and more particularly to peripheral device bays with guiding features and peripheral device carriers.

2. Description of the Related Art

Many computer systems, including personal computers, workstations, servers, and embedded systems are designed to have multiple peripheral devices included in the system. A typical personal computer system includes a processor, associated memory and control logic and a number of peripheral devices that provide input and output (I/O) for the system. Such peripheral devices include, for example, compact disk read-only memory (CD-ROM) drives, hard disk drives, floppy disk drives, and other mass storage devices such as tape drives, compact disk recordable (CD-R) drives or digital video/versatile disk (DVD) drives. Additionally, computer systems often have the capability to interface with external enclosures that include additional peripheral devices.

In many computer systems, it is desirable to include the maximum number of peripheral devices, e.g. hard drives, that can be enclosed in the chassis of the computer system. Similarly, if an external enclosure is used for hard drives, it is also desirable to design the enclosure to optimize space for the hard drives. One type of computer system where it is particularly desirable to optimize hard drive space is the network server. A network server is a focal point for processing and storage in a network, as the network server is responsible for distribution of application programs and data to client computer systems. Because of resource demands, network servers typically have several hard disk drives contained in a peripheral bay and providing nonvolatile storage for the application programs and data.

Additionally, multiple disk drives can be configured to cooperate advantageously using technology generally known as redundant array of inexpensive disks (RAID). RAID systems are particularly useful in the environment of network servers because they provide data redundancy, such that if a single disk drive fails, the data stored thereon can be reconstructed from the data stored on the remaining disks. In the most sophisticated network servers and RAID systems, a failed disk drive can be replaced and the data thereon restored by software without interrupting the server's operation. In so-called "hot plugging," the failed disk drive is removed and a new one installed in its place without cutting off the power to the drive or server, and without rebooting the server. A disk drive with this capability is often referred to as "hot-pluggable." One consequence of using hot-pluggable hard drives is that additional mounting hardware is required in a peripheral bay so that individual drives may be easily inserted and removed.

While designers of peripheral bays, computer system chassis, and external peripheral enclosures often seek to accommodate as many of a particular type of device as possible, they also desire the flexibility of accommodating a variety of different types of devices. For example, hard drives come in a variety of heights including one inch and 1.6 inches. A designer of a peripheral bay might choose to include mounting features so that a maximum number of one inch hard drives can be accommodated, for example five one inch hard drives. However, if that same drive bay is used for 1.6 inch hard drives, no more than two such drives can be accommodated using the same mounting features, thereby wasting space and failing to optimize the drive bay.

One solution is to have different peripheral bays for different sizes of hard drives. Thus, there would be one peripheral bay optimized for the maximum number of one inch hard drives, and a second peripheral bay optimized for 1.6 inch drive bays. Consequently, the manufacturer of the computer system must be able to install different bays depending on a customer's drive selection. Additionally, a user who desires to switch from one drive size to another must remove a currently installed peripheral bay, and install a new peripheral bay. Either circumstance leads to additional assembly/modification effort, multiple different peripheral bay parts, and a weaker chassis structure because the peripheral bay must be removable instead of permanently installed in the chassis.

Another solution is to use a single drive bay with movable mounting features. For example, a drive bay can have multiple sets of mounting slots to which driver carrier guides are attached. To allow a maximum number of one inch drives, a user or manufacturer places the carrier guides in those mounting slots positioned to allow the maximum number of one inch drives in the drive bay. To allow the maximum number of 1.6 in hard drives, the user or manufacture removes the carrier guides from the mounting slots located for one inch drives, and installs the guides in mounting slots for 1.6 inch drives. Unfortunately, such a peripheral bay system requires added effort on the part of a manufacturer or user to configure or reconfigure a drive bay. Additionally, users and manufacturers must be careful to install certain guides in certain locations, i.e. one can install a guide in a location designated for one inch drives and then mistakenly install the next guide in a location for 1.6 inch drives, thereby wasting drive bay space.

Accordingly, it is desirable to have a peripheral device bay for a computer system chassis or external enclosure that will accommodate the maximum number of devices for each of a variety of different types, including sizes, of peripheral devices while simultaneously minimizing the effort required by users and manufactures to configure and reconfigure the bay for different types of peripheral devices. Additionally, it is desirable that possibility of mis-configuration of the bay is minimized. Furthermore, such a bay should utilize peripheral device carriers that are easy to insert and remove from the bay while still allowing optimization of peripheral device bay space.

SUMMARY OF THE INVENTION

It has been discovered that a peripheral device mounting apparatus including a peripheral device bay with carrier guides located to accommodate at least two different types of peripheral devices, and a keying mechanism allowing carrier insertion only into certain carrier guides, advantageously provides optimal use of the device bay space for a particular type of peripheral device. Additionally, the keying mechanism prevents installation of a peripheral device into the bay in a location that wastes bay space.

Accordingly, one aspect of the present invention provides a peripheral device mounting apparatus. The apparatus includes a peripheral device bay having a first plurality of carrier guides on a first interior surface and a second plurality of carrier guides on a second interior surface. The second interior surface opposes the first interior surface, and each of the first plurality of carrier guides corresponds to a parallel opposing carrier guide from the second plurality of carrier guides. A keying mechanism extends along a front edge of the peripheral device bay. The keying mechanism includes a first edge and a first plurality of guiding slots formed along the first edge. The first plurality of guiding slots guide a peripheral device carrier retaining a first type of peripheral device. The keying mechanism is located adjacent to the peripheral device bay so that the first edge prevents the insertion of peripheral device carriers into the peripheral device bay except through the first plurality of guiding slots.

In another aspect of the invention, a computer system includes a processor, a memory coupled to the processor, and a chassis supporting the memory and the processor. The chassis includes a peripheral device mounting apparatus. The apparatus includes a peripheral device bay having a first plurality of carrier guides on a first interior surface and a second plurality of carrier guides on a second interior surface. The second interior surface opposes the first interior surface, and each of the first plurality of carrier guides corresponds to a parallel opposing carrier guide from the second plurality of carrier guides. A keying mechanism extends along a front edge of the peripheral device bay. The keying mechanism includes a first edge and a first plurality of guiding slots formed along the first edge. The first plurality of guiding slots guide a peripheral device carrier retaining a first type of peripheral device. The keying mechanism is located adjacent to the peripheral device bay so that the first edge prevents the insertion of peripheral device carriers into the peripheral device bay except through the first plurality of guiding slots.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
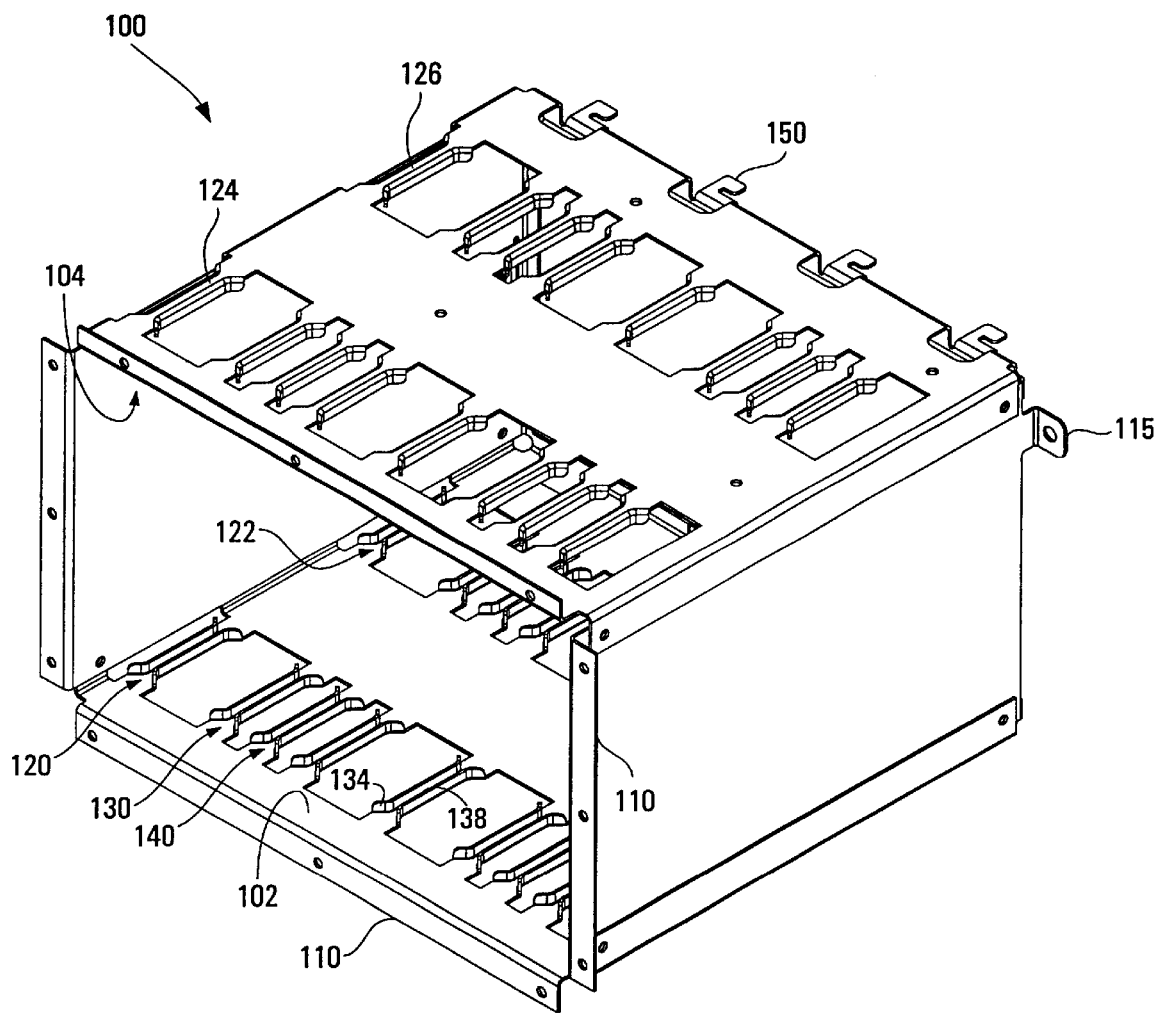
FIG. 1 is a perspective view of a peripheral device bay.

FIG. 1 shows a peripheral device bay 100 designed to contain hard disk drives retained by peripheral device carriers. Bay 100 generally has a box-shaped construction with a front opening allowing the insertion and extraction of peripheral devices. First interior side surface 102 and opposing second interior side surface 104 each have a plurality of carrier guides, for example carrier guides 120, 122, 124 and 126. Each carrier guide on the first interior side surface 102 is parallel to and directly opposite from another carrier guide on the second interior side surface 104. This positioning of carrier guides as well as the use of four carrier guides for each carrier inserted (i.e. two guides from surface 102 and two from surface 104) facilitates both the insertion/extraction of peripheral device carriers and secure retention of the carriers. However, bay 100 need not have four guides for each carrier. For example, carrier guide 120 and either one of carrier guides 124 and 126 are sufficient to allow insertion/extraction of a peripheral device carrier. Alternatively, carrier guide 120 can extend further into bay 100, thereby obviating the need for carrier guide 122. Moreover, surfaces 102 and 104 need not be parallel as shown, as long as the carrier guides used in the bay continue to accommodate peripheral device carriers.

Carrier guides 120, 130, and 140 are located across first interior side surface 102 so as to accommodate a variety of different types of peripheral devices and still provide for optimal use of device bay space. For example, carrier guide 120 (as well as associated carrier guides 122, 124 and 126) is located to receive a peripheral device carrier that retains either a one inch or a 1.6 in hard drive. When a one inch hard drive retained by a carrier is inserted into carrier guides 120, 122, 124 and 126, carrier guide 130 is left unobstructed so that it can receive another one inch drive retained by a carrier. Thus, carrier guides 120 and 130 (as well as other carrier guides in bay 100) are located a particular distance from each other so that the bay is optimized to contain the maximum number of one inch hard drives that bay volume will allow. When a 1.6 inch hard drive retained by a carrier is inserted into carrier guides 120, 122, 124 and 126, carrier guide 130 and/or other guides associated with carrier guide 130 are obstructed by the carrier and cannot be used. However, carrier guide 140 is located far enough from carrier guide 120 to allow another carrier retaining a 1.6 inch hard drive to be inserted into the bay, thereby optimizing the bay volume for 1.6 inch hard drives. Thus, some carrier guides (e.g. guide 120) will accommodate several types of peripheral devices, while other carrier guides (e.g. guides 130 and 140) are designed to receive only one type of peripheral device. Nevertheless, the use of a variety of different carrier guides in the same bay permits the bay space to contain the maximum number of either type of peripheral device.

Carrier guides can be constructed in a variety of different ways, depending in part on the construction of the carriers used with the bay. For example, carrier guides 120, 130, and 140, are channels integrally formed from interior side surface 102 of bay 100. Each guide has a front portion 134 that is wider than the majority of the guide, thereby facilitating insertion of a carrier. Each guide also includes an interior portion 138 easing carrier insertion/extraction and providing support for the inserted carriers. Consequently, the carrier guides shown in FIG. 1 have a substantially U-shaped cross section. Those of ordinary skill in the art will readily recognize that a variety of different carrier guide designs can be used including rails, groves formed by pairs of rails or lances, slots, and the like.

Peripheral device bay 100 includes a variety of mounting features including mounting brackets 110, mounting lug 115, and tabs 150. Mounting brackets 110 allow bay 100 to be fastened to a chassis or housing, such as chassis 510 of FIG. 5. Alternatively, the device bay can be an integral feature of a chassis, thereby obviating the need for mounting brackets 110. Tabs 150 and mounting lug 115 serve as mounting features for a printed circuit board (not shown) interfacing peripheral devices to other devices such as power supplies or a processor of a computer system. Bay 100 is preferably constructed from sheet metal, but may be formed from any other suitable material such as plastic.

Figure 2:
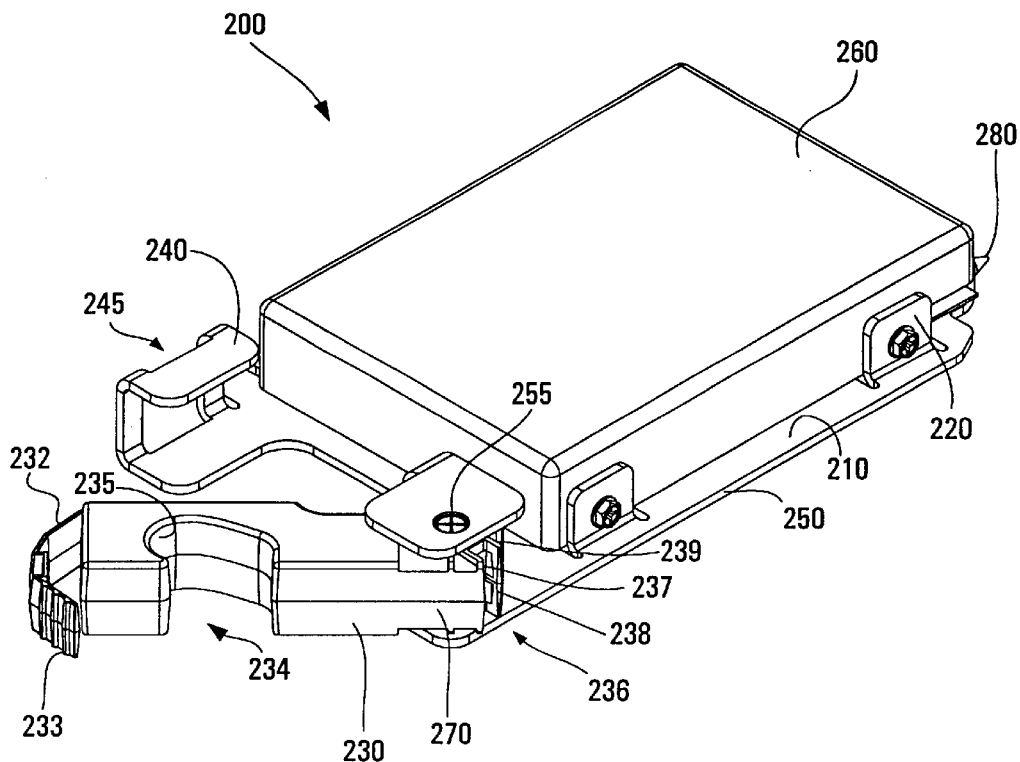
FIG. 2 is a perspective view of a peripheral device carrier including a one inch hard drive.

FIG. 2 illustrates a peripheral device carrier 200 for retaining peripheral devices (e.g. one inch high hard drive 260) for installation into peripheral device bay 100. The carrier includes a base 210, peripheral device mounting features 220, lever 230, and clip 240. Base 210 has two edges 250 which fit into the guides of bay 100, thereby allowing the carrier to be smoothly inserted and extracted from the carrier. Lever 230 is rotatably coupled to a front portion of the base by hinge 255. Lever 230 need not be coupled directly to the base, but should be rotatable with respect to the base in order to allow a user to easily insert and extract the carrier. Base 210 can be, for example, a metal plate, plastic, or a printed circuit board. Lever 230 is preferably constructed from plastic, but can also be constructed from a variety of suitable materials including metal.

One end of lever 230 includes a deflectable locking tab 232 that is deflectable in a direction along the length of the lever. Deflectable locking tab 232 is flexible enough so that when the lever is pushed toward the carrier, the locking tab can be deflected toward the opposite end of the lever, thereby allowing the locking tab to be received by clip 240 as the locking tab deflects down and into clip opening 245. When locking tab 232 is engaged by clip 240, the lever is in a closed position, and thus lever 239 and clip 240 form a handle by which carrier 200 can be carried. When locking tab 232 is not engaged by clip 240, lever 230 it is said to be in an open position. Ribs 233 provide a textured surface for users to actuate the deflectable locking tab using, for example, a thumb. Those having ordinary skill in the art will readily recognize that a variety of different selectively engageable schemes can be used allowing the lever to be opened and closed and providing secure retainment. Lever 230 also includes a grip 234 with a recess 235. Recess 235 is sized to receive one or more fingers so that a user can readily grasp lever 230. Grip 234, recess 235, and locking tab 232 are located so that opening and closing the lever can be accomplished using one hand. For example, a user can open the lever by sliding their index finger into the recess and simultaneously using their thumb to depress locking tab 232. Once the locking tab is released from clip 240, lever 230 can be pulled away from the carrier, rotating about hinge 255.

Lever 230 alo includes engaging portion 236 having first and second camming surfaces 237 and 238. For insertion of carrier 200, lever 230 is rotated so that it is approximately parallel with carrier edge 250 and the carrier is inserted into bay 100 along the carrier guides. The carrier moves into the bay until first camping surface 237 makes contact with a camming edge located along the front of the peripheral device bay. The camming edge can be a feature of the drive bay, a feature of the chassis in which the drive bay is mounted, or an edge 410 or 410 of the keying mechanism shown in FIG. 4. As the first camming surface 237 comes into contact with the camming edge, carrier alignment features such as alignment pin 280 and/or connectors (not shown) can engage or begin to engage a printed circuit board located at the rear of the peripheral device bay. As lever 230 is rotated toward the carrier, second camming surface 238 engages the camming edge and acts to lever the carrier into the bay. Insertion is complete when clip 240 engages locking tab 232, thereby securing the lever between clip 240 and the camming edge. Additionally, as the carrier is secured into the bay, any connection between the carrier and/or the device retained by the carrier and the printed circuit board at the rear of the bay is completed.

To remove carrier 200 from device bay 100, the lever is unlocked from clip 240 by depressing deflectable locking tab 232 and pulling the lever away from the carrier. First camming surface 237 engages the camming edge, levering the carrier out of the bay. Alternatively, a third camming surface 239 can engage a surface of the drive bay or chassis to lever the carrier out of the bay. Once the carrier is released from the bay and any connectors on the carrier are disconnected from the printed circuit board at the rear of the bay, the carrier can be pulled out of the bay by lever 230. Whether during insertion or extraction, the camming action of engagement portion 236 and the overall performance of carrier 200 is enhanced by the width of the engaging portion. Those having ordinary skill in the art will readily recognize that engaging portion 236 can utilize a variety of different features to help secure carrier 200 into a bay including, for example, a hook or a single flat surface. Additionally, the camming edge can take a variety of forms including a lip, a ledge, a rib, a protrusion, and even a surface.

Lever 230 also includes a cosmetic surface 270 upon which cosmetic features, e.g. an embossed or molded logo, can be located. Clip 240 can be a separate part coupled to base 210, and need not be integrally formed from the base as shown in FIG. 2. Additionally, although peripheral device mounting features 220 are shown as lugs integrally formed from the base and including through holes for fasteners, a variety of mounting features can be used, and the mounting features need not be formed from the base. Carrier 200 can also be used to retain more than one type of peripheral device. For example, FIG. 2 shows carrier 200 retaining a one inch hard drive 260, but the same carrier can retain a 1.6 inch hard drive. A face plate or filler panel (not shown) can also be included with carrier 200 located, for example, along the width of the carrier, i.e. perpendicular to edge 250, between hard drive 260 and clip 240. Such a face plate or filler panel can serve as an additional cosmetic surface or as a plate covering open spaces in the bay.

Figure 3B:
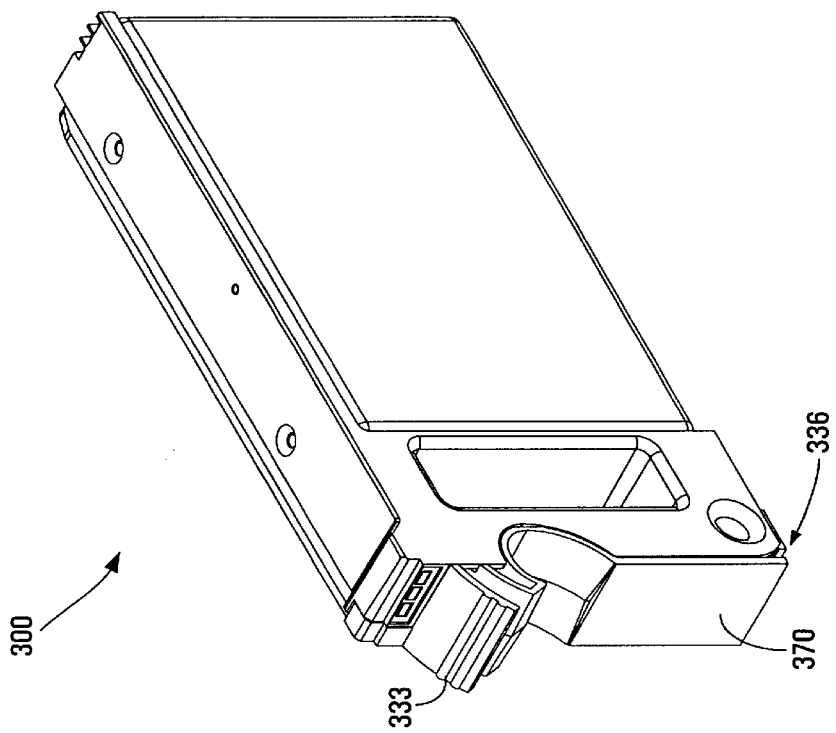
FIGS. 3A and 3B are perspective views of another peripheral device carrier.
Figure 3A:
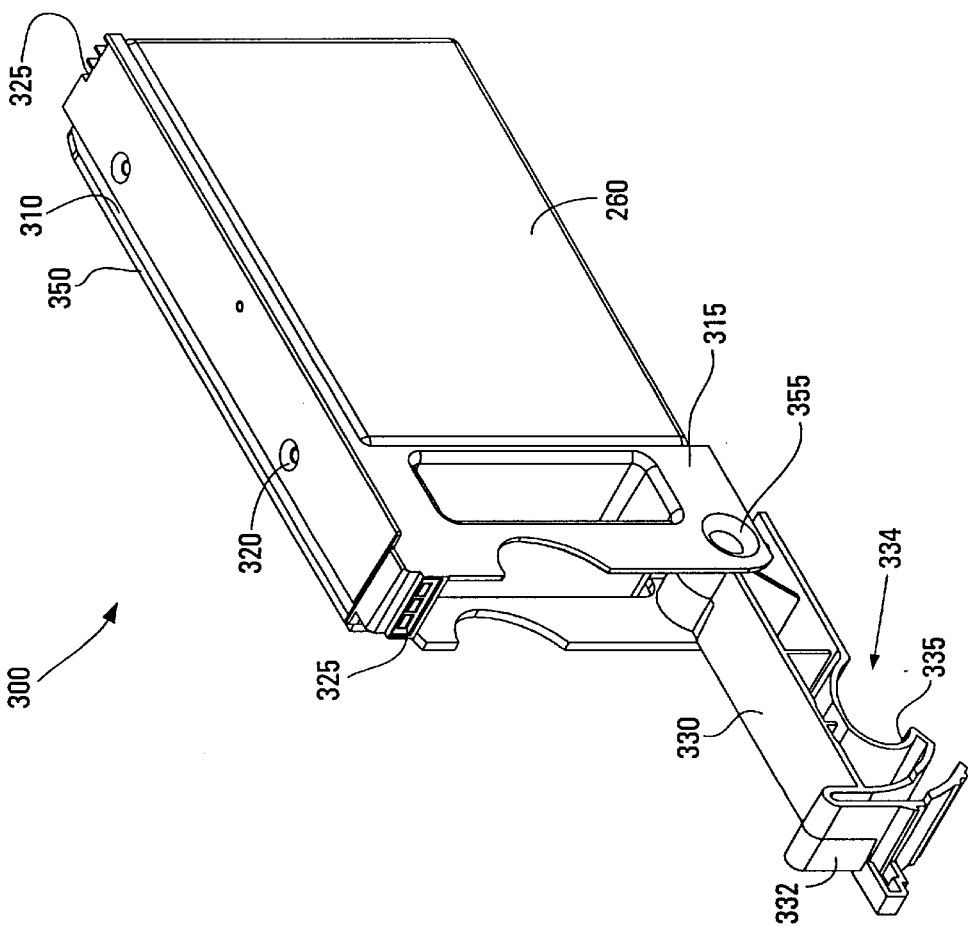

FIGS. 3A and 3B illustrate another peripheral device carrier 300. Carrier 300 includes a base 310, a handle 315 coupled to the base, peripheral device mounting features 320, and a lever 330. Base 310 has two edges 350 which fit into the guides of bay 100, thereby allowing the carrier to be smoothly inserted and extracted from the carrier. Lever 330 is rotatably coupled to handle 315 through hinge 355 and is rotatable with respect to the base.

One end of lever 330 includes a deflectable locking tab 332 that is deflectable in a direction along the length of the lever. Deflectable locking tab 332 operates in a manner similar to deflectable locking tab 232 and can be retained by a clip (not shown) in handle 315. When locking tab 332 is engaged by the clip, the lever is in a closed position, and when the locking tab is not engaged by the clip, the lever is said to be in an open position. Ribs 333 provide a textured surface for users to actuate the deflectable locking tab using, for example, a thumb. Lever 330 also includes a grip 334 with a recess 335. Recess 335 is sized to receive one or more fingers so that a user can readily grasp lever 330. Grip 334, recess 335, and locking tab 332 are located so that opening and closing the lever can be accomplished using one hand Once the locking tab is released from the clip, lever 330 can be pulled away from the carrier, rotating about hinge 355.

Lever 330 also includes an engaging portion 336 that allows carrier 300 to engage and disengage a camming edge depending upon movement of lever 330, and keeps the carrier secured in a peripheral device bay when the carrier is fully inserted and the lever is place in its closed position. Cosmetic features can be located on cosmetic surface 370. Additionally, handle 315 includes light pipes 325 that extend from the front of the carrier to the rear of the carrier. Light pipes 325 bring light from hard disk drive 260 or from a printed circuit board located along the rear of a peripheral device bay to the front of the carrier where it can more easily be seen. For example, light pipes 325 can be positioned to receive light from light emitting diodes (LEDs) mounted on hard drive 260 or a printed circuit board. Such LEDs can indicate, for example, drive activity and device failure. Light pipes 325 are commonly formed from a clear plastic or glass. A face plate or filler panel (not shown) can also be included with carrier 300 attached, for example, to handle 315. Such a face plate or filler panel can serve as an additional cosmetic surface or as a plate covering open spaces in the bay.

Figure 4:
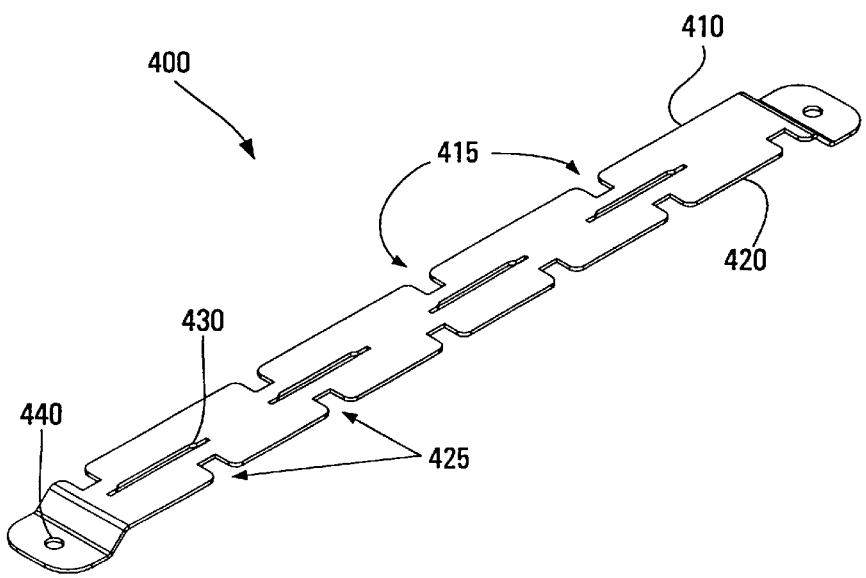
FIG. 4 is a perspective view of a keying mechanism.

Referring to FIG. 4, a keying mechanism 400 is shown that is used in conjunction with a device bay like device bay 100 to facilitate placement of carriers in the proper carrier guides given the type of device retained by the carriers. Keying mechanism 400 typically extends along a front edge of a peripheral device bay (See FIG. 5). Keying mechanism 400 has a first edge 410 and a second edge 420. Edges 410 and 420 are shown as parallel opposing edges, but need not be so. For example, keying mechanism 400 can have a shape similar to an angle iron or bracket wherein the first edge and the second edge are perpendicular to each other and meet at a common corner. Edge 410 includes guiding slots 415 spaced apart so that carriers can only be inserted in carrier guides the are aligned with the guiding slots. For example, guiding slots 415 are positioned to correspond to the carrier guides that are used when filling a peripheral device bay with the maximum number of carriers (here four) retaining 1.6 inch hard drives. Similarly, edge 420 has guiding slots 425 positioned to correspond to the carrier guides that are used when filling the peripheral device bay with the maximum number of carriers (six) retaining one inch hard drives. Thus, a peripheral device mounting apparatus including a peripheral device bay 100 and a keying mechanism 400 controls which configuration of drives is used.

Keying mechanism 400 includes mounting features such as mounting slots 430 and mounting holes 440. These mounting features allow the keying mechanism to be removably attached to a device bay or chassis so that the appropriate edge can be located (i.e. by changing the orientation of the keying mechanism) to guide peripheral device carriers into the peripheral device bay. Keying mechanism 400 can also include guiding tabs (not shown) to help position the keying mechanism with respect to the chassis or drive bay before fasteners secure it to the chassis or bay. As previously noted, edges 410 and 420 can serve as camming edges for peripheral device carriers 200 and 300.

Figure 5:
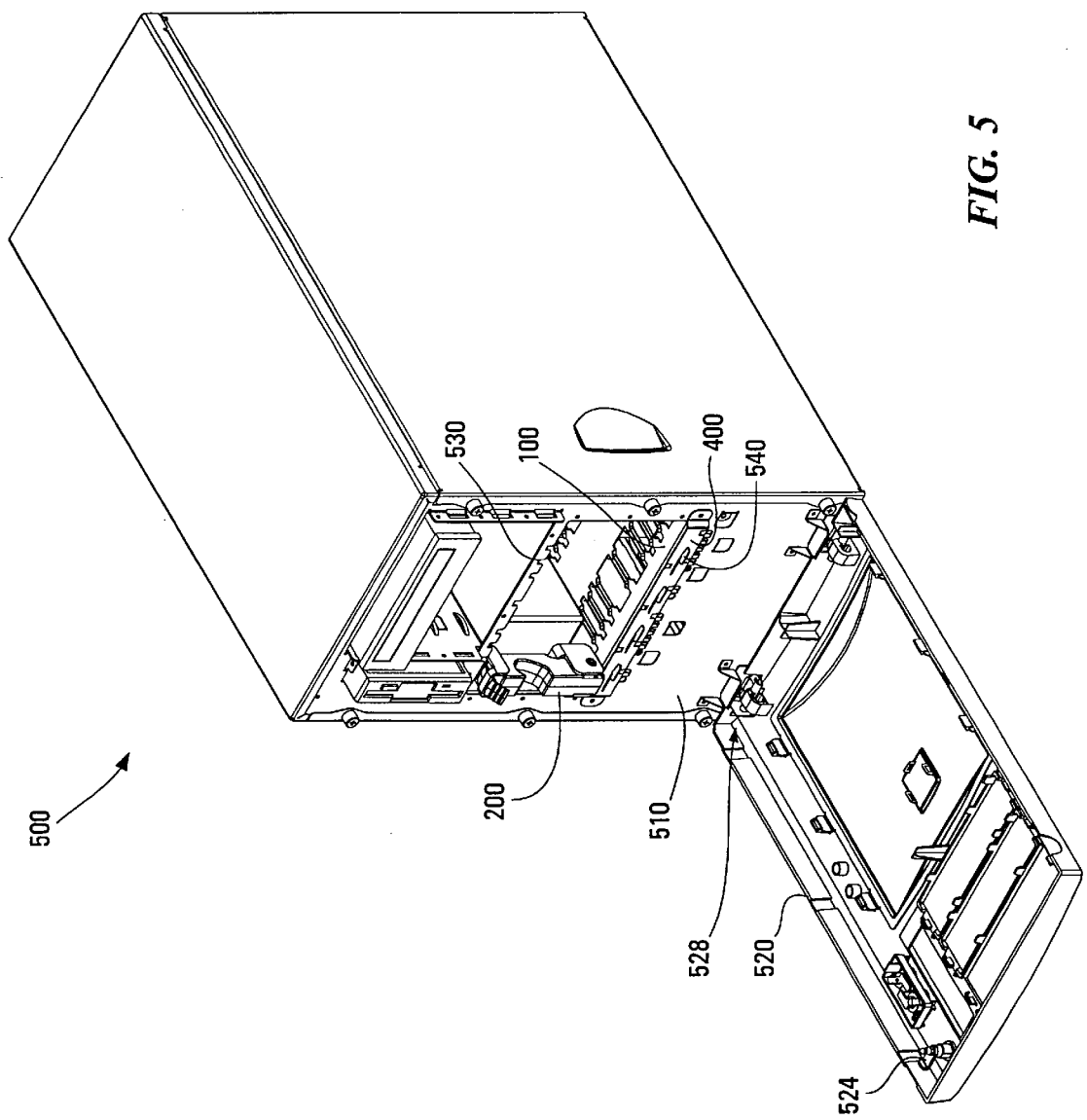
FIG. 5 is a perspective view of an assembled computer system including the device bay, the carrier and the keying mechanism of FIGS. 1, 2, and 4, respectively.

FIG. 5 shows a computer system 500 including chassis 510, door 520, peripheral device bay 100, peripheral device carrier 200, and keying mechanism 400. Door 520 includes a key lock assembly 524 and attaches to chassis 510 via hinges 528. Examples of key lock assembly 524 and hinge 510 are found in U.S. Patent application Ser. No. 09/013,767 entitled "Combination Keylock Device and Securing Device," by Ty R. Schmitt, filed on the same day as the present application, and incorporated herein by reference.

Peripheral device bay 100 is shown attached to chassis 510. This can be accomplished by, for example, riveting bay 100 to the chassis using bay mounting brackets 110. Chassis 100 also includes guiding slots 530 similar to the guiding slots 419 and 425 of keying mechanism 400. However, chassis 510 has guiding slots 530 that correspond to each of the carrier guides of bay 100, and not merely selected carrier guides, as is the case with guiding slots 415 and 425. Keying mechanism 400 is located along the lower front edge of bay 400, but with edge 410 obstructing carrier insertion into the bay except through guide slots 415. Because keying mechanism 400 is oriented as shown, carriers can only be inserted into carrier guides corresponding to the optimal installation of carriers retaining 1.6 inch hard drives. Carrier 200 is shown installed in bay 100 and retaining a 1.6 inch hard drive. Keying mechanism 400 is shown attached to the chassis using hooks 540 that are received by mounting slots 430, however the keying mechanism can be attached to the chassis using a variety of different features including, for example, mounting holes 440.

Although the examples shown in FIGS. 1–5 illustrate peripheral devices that are hard disk drives, it will be apparent to those of ordinary skill in the art that a variety of different peripheral devices can take advantage of the peripheral device bay, keying mechanism, and peripheral device carriers disclosed in this application. Additionally, other devices associated with computer system operation, for example removable power supplies, may also benefit from the bay, keying mechanism, and carriers described herein.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A peripheral device mounting apparatus comprising:
a peripheral device bay including a first plurality of carrier guides on a first interior surface and a second plurality of carrier guides on a second interior surface, the second interior surface opposing the first interior surface, each of the first plurality of carrier guides corresponding to a parallel opposing carrier guide from the second plurality of carrier guides; and
a movable keying mechanism extending along a front edge of the peripheral device bay, the keying mechanism including:
a first edge;
a first plurality of guiding slots formed along the first edge, the first plurality of guiding slots positioned to guide a peripheral device carrier retaining a first type of peripheral device;
a second edge; and
a second plurality of guiding slots formed along the second edge, the second plurality of guiding slots positioned to guide a peripheral device carrier retaining a second type of peripheral device;
the movable keying mechanism being selectively located adjacent to the peripheral device bay so that one of the first edge and the second edge prevents insertion of peripheral device carriers into the peripheral device bay except through the first plurality of guiding slots and the second plurality of guiding slots, respectively.

2. The peripheral device mounting apparatus of claim 1 wherein at least one of the carrier guides is integrally formed from the peripheral device bay.

3. The peripheral device mounting apparatus of claim 1 wherein at least one of the carrier guides is a channel having a front portion, an interior portion, and a substantially U-shaped cross-section.

4. The peripheral device mounting apparatus of claim 1 wherein at least one of the carrier guides includes a pair of lances forming a groove.

5. The peripheral device mounting apparatus of claim 1 wherein the keying mechanism includes at least one mounting feature.

6. The peripheral device mounting apparatus of claim 5 wherein the at least one mounting feature is selected from a through hole and a mounting slot.

7. The peripheral device mounting apparatus of claim 1 wherein the first edge and the second edge are parallel opposing edges.

8. The peripheral device mounting apparatus of claim 1 wherein the first plurality of carrier guides are located so that the peripheral device bay is capable of accommodating a maximum number of carriers retaining the first type of peripheral device and so that the peripheral device bay is capable of accommodating a maximum number of carriers retaining the second type of peripheral device.

9. The peripheral device mounting apparatus of claim 1 wherein the first type of peripheral device is a one inch hard drive and the second type of peripheral device is a 1.6 inch hard drive.

10. The peripheral device mounting apparatus of claim 1 wherein at least one of the first plurality of carrier guides only receives carriers retaining the first type of peripheral device, at least one of the first plurality of carrier guides only receives carriers retaining the second type of peripheral device, and at least one of the first plurality of carrier guides receives carriers retaining the first type of peripheral device and carriers retaining the second type of peripheral device.

11. The peripheral device mounting apparatus of claim 1 further comprising a chassis wherein the peripheral device bay is coupled to the chassis and the keying mechanism is coupled to the chassis.

12. A computer system comprising:
   a processor;
   a memory coupled to the processor;
   a chassis supporting the processor and the memory, the chassis including:
      a peripheral device bay having a first plurality of carrier guides on a first interior surface and a second plurality of carrier guides on a second interior surface, the second interior surface opposing the first interior surface, each of the first plurality of carrier guides corresponding to a parallel opposing carrier guide from the second plurality of carrier guides; and
      a movable keying mechanism extending along a front edge of the peripheral device bay, the keying mechanism including:
         a first edge;
         a first plurality of guiding slots formed along the first edge, the first plurality of guiding slots positioned to guide a peripheral device carrier retaining a first type of peripheral device;
         a second edge; and
         a second plurality of guiding slots formed along the second edge, the second plurality of guiding slots positioned to guide a peripheral device carrier retaining a second type of peripheral device;
      the movable keying mechanism being selectively located adjacent to the peripheral device bay so that one of the first edge and the second edge prevents insertion of peripheral device carriers into the peripheral device bay except through the first plurality of guiding slots and the second plurality of guiding slots, respectively.

13. The computer system of claim 12 further comprising a peripheral device carrier coupled to the peripheral device bay, the peripheral device carrier retaining a first type peripheral device.

14. The computer system of claim 13 wherein the first type peripheral device is selected from a one inch hard drive and a 1.6 inch hard drive.

15. The computer system of claim 12 further comprising a peripheral device carrier coupled to the peripheral device bay, the peripheral device carrier including:
   a base;
   a lever rotatable with respect to the base, the lever including:
      a first end and a second end;
      a grip including a recess sized to accommodate a finger of a user, the grip facilitating movement of the lever by the user;
      a deflectable locking tab located at the first end;
      an engagement portion located at the second end; and
   a clip coupled to the base, the clip being capable of receiving the locking tab of the lever in a closed position.

16. The computer system of claim 15 wherein the base further includes a first base edge and an opposing second base edge, the first and second base edges being received by a selected one of the first plurality of carrier guides and a selected one of the second plurality of carrier guides, respectively.

17. The computer system of claim 12 wherein at least one of the carrier guides is integrally formed from the peripheral device bay.

18. The computer system of claim 12 wherein at least one of the carrier guides is a channel having a front portion, an interior portion, and a substantially U-shaped cross-section.

19. The computer system of claim 12 wherein at least one of the carrier guides includes a pair of lances forming a groove.

20. The computer system of claim 12 wherein the keying mechanism includes at least one mounting feature.

21. The computer system of claim 12 wherein the first edge and the second edge are parallel opposing edges.

22. The computer system of claim 12 wherein the first plurality of carrier guides are located so that the peripheral device bay is capable of accommodating a maximum number of carriers retaining the first type of peripheral device and so that the peripheral device bay is capable of accommodating a maximum number of carriers retaining the second type of peripheral device.

23. The computer system of claim 12 wherein the first type of peripheral device is a one inch hard drive and the second type of peripheral device is a 1.6 inch hard drive.

24. The computer system of claim 12 wherein at least one of the first plurality of carrier guides only receives carriers retaining the first type of peripheral device, at least one of the first plurality of carrier guides only receives carriers retaining the second type of peripheral device, and at least one of the first plurality of carrier guides receives carriers retaining the first type of peripheral device and carriers retaining the second type of peripheral device.

* * * * *